(12) United States Patent
Huang et al.

(10) Patent No.: US 8,471,357 B2
(45) Date of Patent: Jun. 25, 2013

(54) INTEGRATED INDUCTOR STRUCTURE

(75) Inventors: Kai-Yi Huang, Taipei (TW); Ta-Hsun Yeh, Hsin-Chu (TW); Yuh-Sheng Jean, Yun-Lin Hsien (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 12/277,309

(22) Filed: Nov. 25, 2008

(65) Prior Publication Data

US 2009/0146252 A1 Jun. 11, 2009

(30) Foreign Application Priority Data

Dec. 7, 2007 (TW) .............................. 96146738 A

(51) Int. Cl.
*H01L 27/08* (2006.01)
(52) U.S. Cl.
USPC .......................................... 257/531; 257/659
(58) Field of Classification Search
USPC ... 257/328, 336, 355, 378, 531, 659; 438/237
See application file for complete search history.

(56) References Cited

U.S. PATENT DOCUMENTS

| | | | |
|---|---|---|---|
| 6,452,249 B1 | 9/2002 | Maeda et al. | |
| 6,537,868 B1 * | 3/2003 | Yu | ................................. 438/237 |
| 6,593,838 B2 | 7/2003 | Yue | |
| 6,753,591 B2 * | 6/2004 | Yu | ................................. 257/531 |
| 6,756,656 B2 | 6/2004 | Lowther | |
| 7,084,481 B2 | 8/2006 | Lowther et al. | |
| 7,135,951 B1 * | 11/2006 | Sidhu et al. | .................... 336/200 |
| 2004/0075136 A1 * | 4/2004 | Cheng | ............................. 257/328 |
| 2007/0262422 A1 * | 11/2007 | Bakalski et al. | ............... 257/659 |

FOREIGN PATENT DOCUMENTS

CN 1416145 5/2003

OTHER PUBLICATIONS

Judith Maget et al., Voltage-controlled substrate structure for integrated inductors in standard digital CMOS technologies, 2002.
English language translation of abstract of CN 1416145 (published May 7, 2003).

* cited by examiner

*Primary Examiner* — Kimberly Rizkallah
*Assistant Examiner* — Errol Fernandes
(74) *Attorney, Agent, or Firm* — McClure, Qualey & Rodack, LLP

(57) ABSTRACT

This invention provides an integrated inductor structure including a substrate, a metal coil layer on the substrate and a dielectric layer between the substrate and the metal coil layer. A well shielding structure for reducing eddy current is disposed in the substrate under the metal coil layer. The well shielding structure is chequered with a plurality of N wells and a plurality of P wells. The N wells and P wells are arranged in a chessboard-like manner. A P+ pickup ring is provided in the substrate to encompass the well shielding structure. A guard ring is formed directly on the P+ pickup ring.

18 Claims, 12 Drawing Sheets

INTEGRATED INDUCTOR STRUCTURE

BACKGROUND OF THE INVENTION

1. Field of the Invention

The present invention relates to a semiconductor passive component, and more particularly to an integrated inductor structure.

2. Description of the Prior Art

Along with the recent trend of system-on-a-chip (SoC) design for IC manufacturing, passive components such as integrated inductors or integrated transformers have been fabricated on high-frequency integrated circuits instead of being external components. It is known that substrate loss and losses due to the series resistance of the inductor's conductive path (which increase with increasing frequency of operation) have been found to adversely affect the quality factor Q.

Some prior art methods such as those disclosed in U.S. Pat. Nos. 6,593,838, 6,756,656, and 7,084,481, the contents of which are incorporated herein in their entirety by reference, teach using patterned ground shields, which are composed of polysilicon or metal, to reduce the eddy current, thereby increasing the quality factor.

However, such approaches, i.e., using polysilicon or metal patterned ground shields to reduce the eddy current, increase parasitic capacitance or displacement current of the integrated inductor and as a result reduce the self-resonance frequency, which adversely affect the applicable frequency range of the inductor component.

SUMMARY OF THE INVENTION

It is one object of the present invention to provide an improved integrated inductor structure having novel chessboard-like or mesh-like well shielding layer, which is capable of minimizing substrate loss induced by eddy current or displacement current.

According to the preferred embodiment, this invention provides an integrated inductor structure including a substrate, a metal coil layer on the substrate and a dielectric layer between the substrate and the metal coil layer. A well shielding layer for reducing eddy current is disposed in the substrate directly under the metal coil layer. The well shielding layer is chequered with a plurality of N type diffusion regions and a plurality of P type diffusion regions. A P+ pickup ring is provided in the substrate to encompass the well shielding layer. A guard ring is formed directly on the P+ pickup ring.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
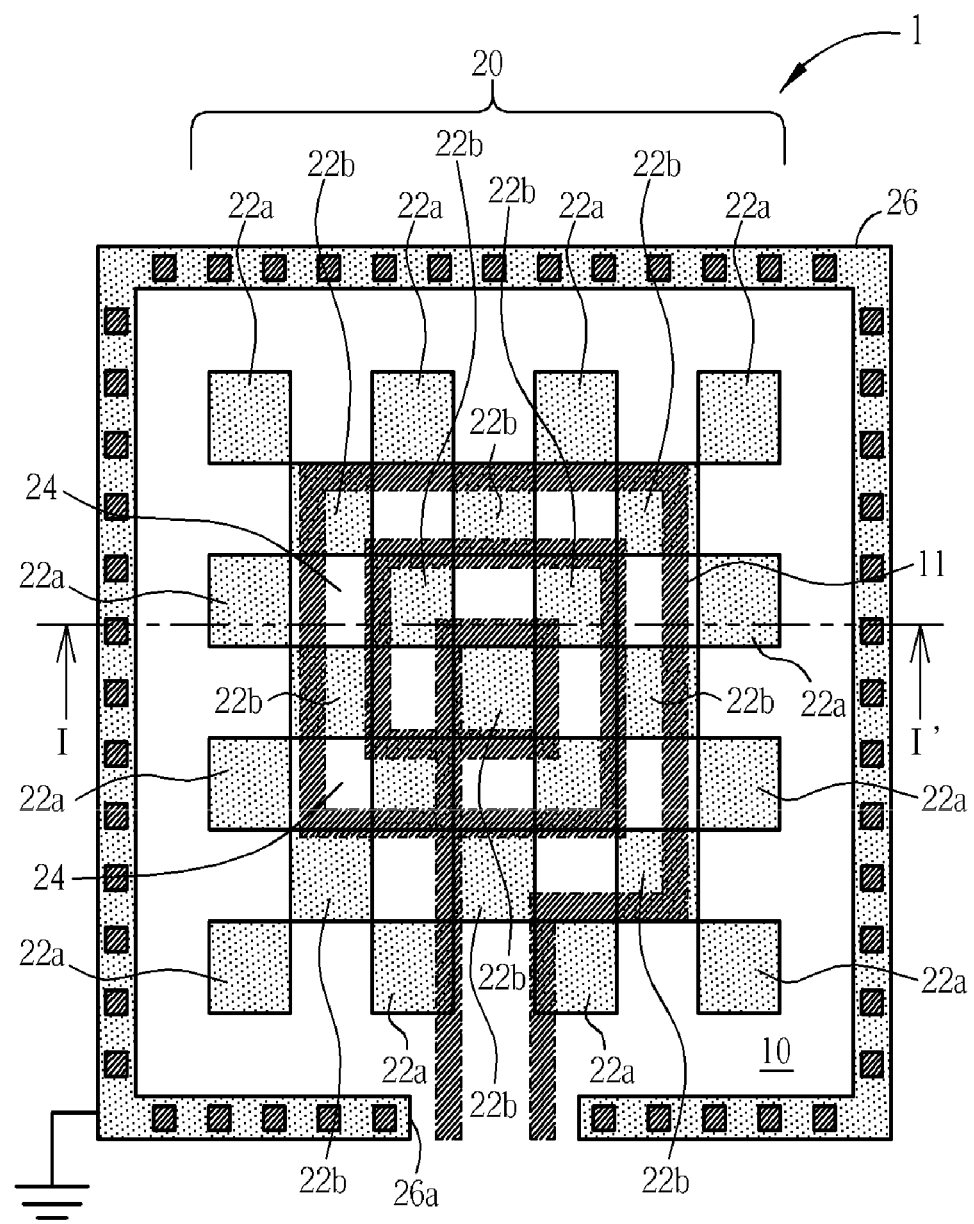
FIG. 1 is a plane view of an integrated inductor structure in accordance with one preferred embodiment of this invention.
Figure 2:
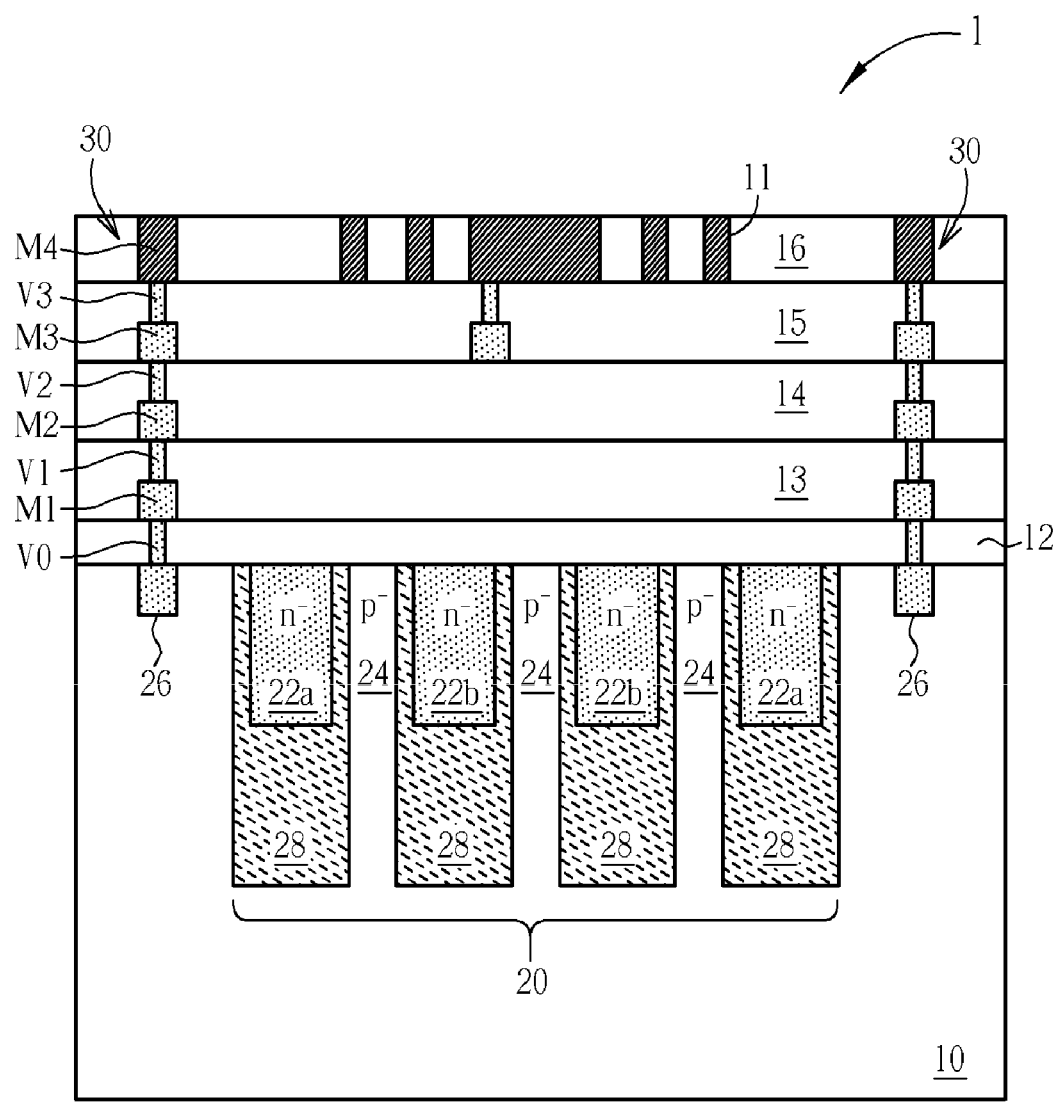
FIG. 2 is a cross-sectional view of the integrated inductor structure taken along line I-I' of FIG. 1.

Please refer to FIG. 1 and FIG. 2. FIG. 1 is a plane view of an integrated inductor structure in accordance with one preferred embodiment of this invention. FIG. 2 is a cross-sectional view of the integrated inductor structure taken along line I-I' of FIG. 1.

As shown in FIGS. 1 and 2, according to the preferred embodiment of this invention, the integrated inductor structure 1 comprises a semiconductor substrate 10 such as a P type silicon substrate, and an inductor metal coil layer 11 disposed on the semiconductor substrate 10. A plurality of dielectric layers 12~15 are interposed between the semiconductor substrate 10 and the inductor metal coil layer 11. The plurality of dielectric layers 12~15 include but not limited to silicon nitride, silicon dioxide, boron-doped silicate glass, borophosphosilicate glass, and/or low dielectric constant (low-k) materials.

A well shielding layer 20 is formed in the semiconductor substrate 10. The well shielding layer 20 is situated directly under the inductor metal coil layer 11. According to the preferred embodiment of this invention, the well shielding layer 20 comprises a plurality of N type diffusion regions 22a, 22b and a plurality of P− diffusion regions 24 arranged in a chessboard-like manner, as best seen in FIG. 1. The plurality of N type diffusion regions 22a, 22b are electrically connected to one another by means of diffusion.

According to the preferred embodiment of this invention, the N type diffusion regions 22a are disposed at the periphery of the well shielding layer 20, while the N type diffusion regions 22b are disposed in the inner area of the well shielding layer 20 and are substantially surrounded by the peripheral N type diffusion regions 22a. The doping concentration of the P− diffusion regions 24 is substantially the same as that of the semiconductor substrate 10. However, in other embodiments, the doping concentration of the P− diffusion regions 24 may be higher than that of the semiconductor substrate 10. In that case, additional P type dopants are implanted into the P− diffusion regions 24 to form shallow P wells thereto.

It is the first germane feature of this invention that the plurality of N type diffusion regions 22a, 22b and the plurality of P− diffusion regions 24 are arranged in a chessboard-like manner or in a mesh-like fashion. The plurality of N type diffusion regions 22a, 22b and the plurality of P− diffusion regions 24 arranged in a chessboard-like manner are capable of effectively interrupting the path of the eddy current, thereby minimizing the influence of the eddy current.

According to the preferred embodiment of this invention, the peculiar chessboard-like layout of the present invention well shielding layer 20, which consists of the plurality of N type diffusion regions 22a, 22b and the plurality of P− diffusion regions 24, can effectively interrupt the eddy current generated at the surface and shallower layer of the semiconductor substrate 10. To effectively avoid deeper eddy current from occurring, according to this invention, an N type deep ion well 28 may be provided under each of the N type diffusion regions 22a, 22b.

According to the preferred embodiment of this invention, the integrated inductor structure 1 further comprises a P+ pick-up ring 26 that encircles the well shielding layer 20. Preferably, the P+ pick-up ring 26 is grounded. One major function of the grounded P+ pickup ring 26 is to absorb the high-frequency noise signals, which are usually originated from the passive device itself. Besides, in operation, the P+ pick-up ring 26 can canalize the eddy current that is formed in the semiconductor substrate 10.

In addition, a guard ring 30 is disposed directly on the P+ pick-up ring 26. The guard ring 30 is composed of a plurality of metal layers and a plurality of contact or via plugs. As shown in FIG. 2, by way of example, the guard ring 30 consists of four metal layers $M_1$~$M_4$ and plugs $V_0$~$V_3$, wherein the metal layers $M_1$~$M_4$ and plugs $V_0$~$V_3$ may comprise aluminum, copper, tungsten, titanium, tantalum, silver, gold, etc. The four metal layers $M_1$~$M_4$ and plugs $V_0$~$V_3$ are fabricated in the dielectric layers 12~16, respectively. The guard ring 30 has a slit 26a through which the inductor metal coil layer 11 communicates with an outer circuit.

Figure 3:
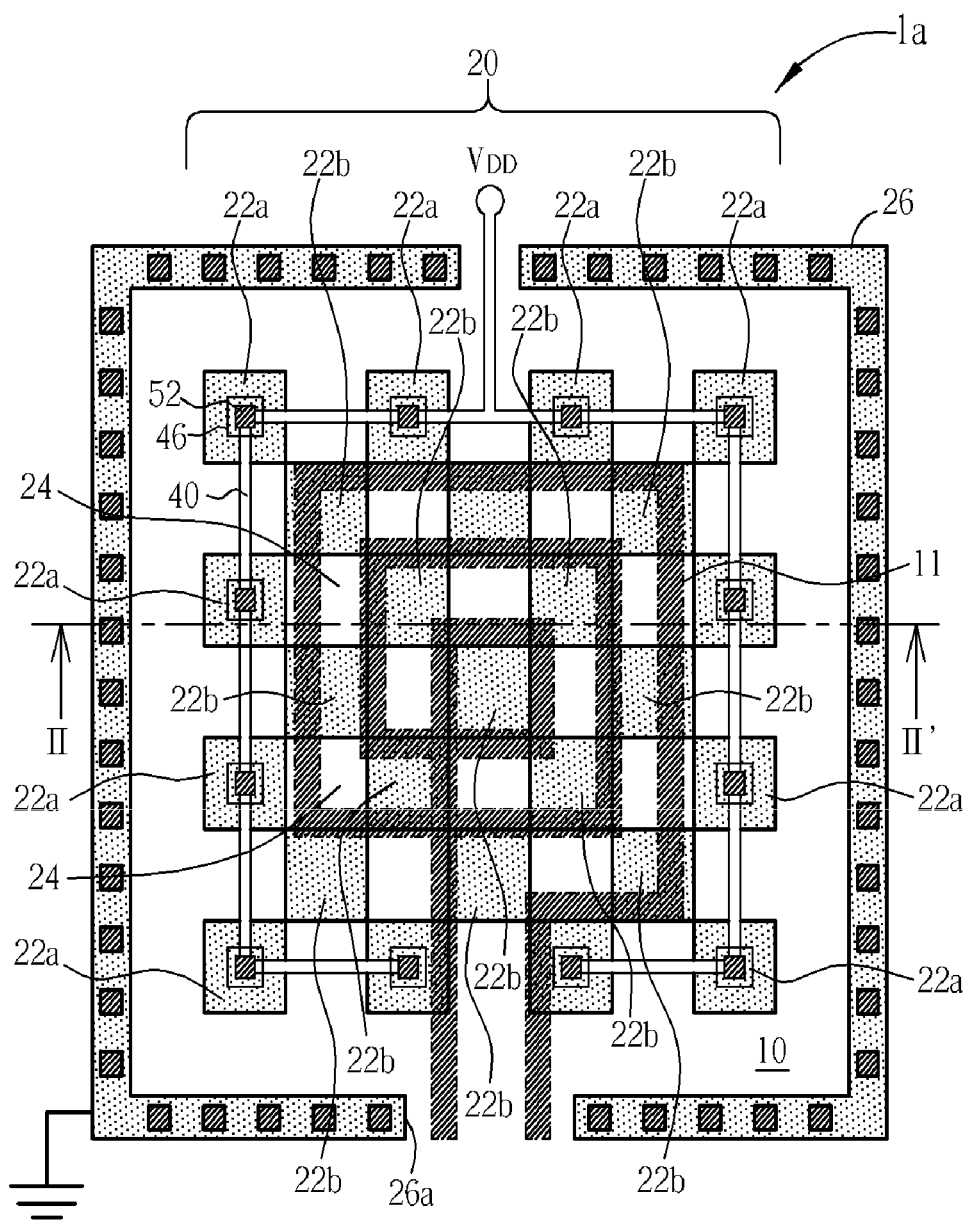
FIG. 3 is a plane view of an integrated inductor structure in accordance with another preferred embodiment of this invention.
Figure 4:
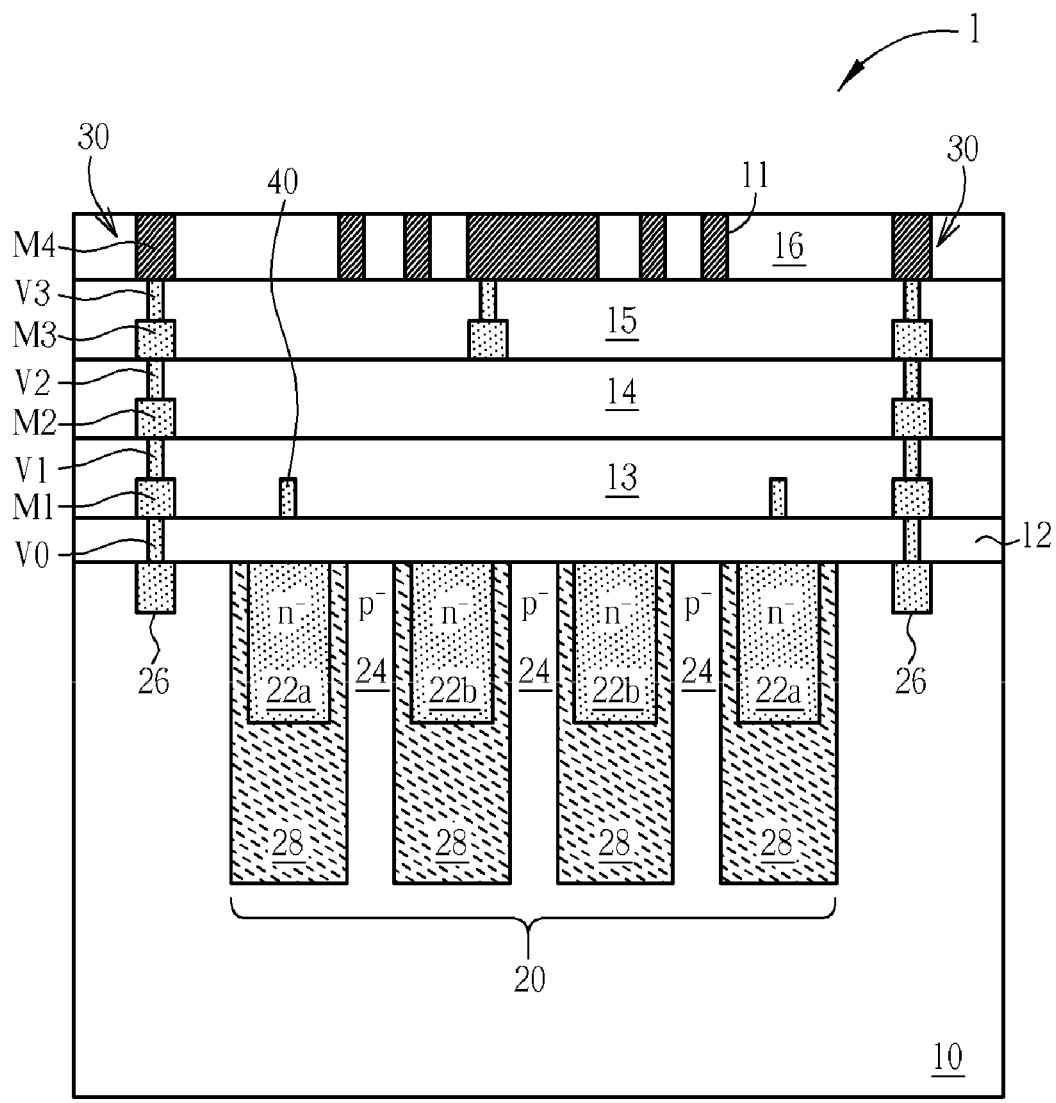
FIG. 4 is a cross-sectional view of the integrated inductor structure taken along line II-II' of FIG. 3.
Figure 5:
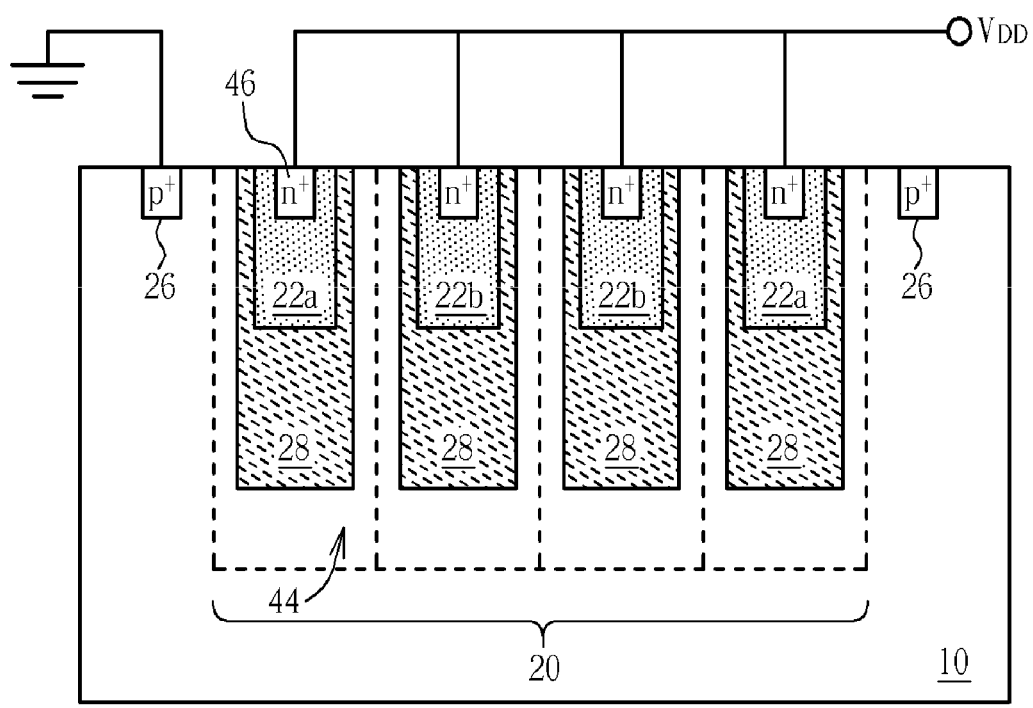
FIG. 5 is a schematic diagram showing the operation condition of the well shielding layer of the inventive integrated inductor structure.

Please refer to FIGS. 3~5. FIG. 3 is a plane view of an integrated inductor structure in accordance with another preferred embodiment of this invention. FIG. 4 is a cross-sectional view of the integrated inductor structure taken along line II-II' of FIG. 3. FIG. 5 is a schematic diagram showing the operation condition of the well shielding layer of the integrated inductor structure, wherein like numeral numbers designate like regions, layers, and elements.

As shown in FIGS. 3 and 4, the integrated inductor structure 1a comprises a semiconductor substrate 10 such as a P type silicon substrate, and an inductor metal coil layer 11 disposed on the semiconductor substrate 10. A plurality of dielectric layers 12~15 are interposed between the semiconductor substrate 10 and the inductor metal coil layer 11 for insulating the semiconductor substrate 10 from the inductor metal coil layer 11.

Likewise, a well shielding layer 20 is formed in the semiconductor substrate 10. The well shielding layer 20 is situated directly under the inductor metal coil layer 11. The well shielding layer 20 comprises a plurality of N type diffusion regions 22a, 22b and a plurality of P– diffusion regions 24 arranged in a chessboard-like manner. The plurality of N type diffusion regions 22a, 22b are electrically connected to one another by means of diffusion. A P+ pick-up ring 26, which encircles the well shielding layer 20, is formed in the semiconductor substrate 10. A guard ring 30 is disposed directly on the P+ pick-up ring 26. The guard ring 30 is composed of a plurality of metal layers and a plurality of contact or via plugs.

The difference between the integrated inductor structure 1a as set forth in FIGS. 3~4 and the integrated inductor structure 1 as set forth in FIGS. 1~2 is that the N type diffusion regions 22a disposed at the periphery of the well shielding layer 20 is picked up by an additional metal pick-up ring 40 or secondary pick-up ring. The metal pick-up ring 40 is coupled to a $V_{DD}$ voltage. Preferably, as shown in FIG. 3, each of the peripheral N type diffusion regions 22a further comprises an N+ diffusion region 46 that is electrically connected to the overlying metal pick-up ring 40 through a contact plug 52.

According to this invention, the metal pick-up ring 40 has two functions. The first function is that the metal pick-up ring 40 provides a positive bias voltage (relative to the semiconductor substrate 10) to the N type diffusion regions 22a, 22b, thereby generating P/N junction 44 within the well shielding layer 20, as best seen in FIG. 5, as well as depletion capacitance that can reduce the parasitic capacitance between the passive device and the semiconductor substrate 10. The second function is that the metal pick-up ring 40 absorbs the high-frequency noise signals originated from the passive device itself and canalizes the residual eddy current in the well shielding layer 20.

According to another preferred embodiment of this invention, the N type diffusion regions 22a are disposed at the periphery of the well shielding layer 20, while the N type diffusion regions 22b are disposed in the inner area of the well shielding layer 20 and are substantially surrounded by the N type diffusion regions 22a. The N type diffusion regions 22a of the well shielding layer 20 and the metal pick-up ring 40 do not overlap with the inductor metal coil layer 11; merely the N type diffusion regions 22b of the well shielding layer 20 overlap with the inductor metal coil layer 11.

To sum up, in addition to the first germane feature of this invention, which is the chessboard-like or mesh-like layout of the well shielding layer 20, the second germane feature of this invention is that the plurality of N type diffusion regions 22a and the metal pick-up ring 40 are deliberately not disposed directly under the inductor metal coil layer 11; that is, substantially, the N type diffusion regions 22a and the metal pick-up ring 40 do not overlap with the inductor metal coil layer 11 from a top view. By providing such configuration, the eddy current induced by the metal pick-up ring 40 is minimized.

Please refer to FIGS. 6~12. FIGS. 6~12 demonstrate some variants of the well shielding layer of the integrated inductor structure according to this invention. It is understood that, for the sake of simplicity, merely the cross section of the well shielding layer is illustrated through FIGS. 6~12, while other elements or layers of the integrated inductor structure such as guard ring and dielectric layers are omitted.

Figure 6:
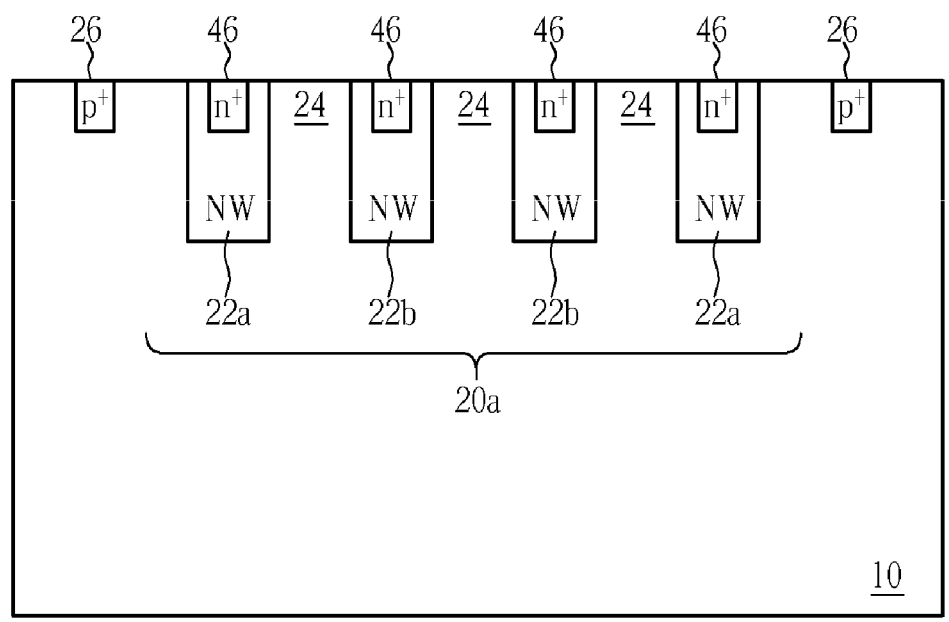
FIGS. 6~12 demonstrate some variants of the well shielding layer of the integrated inductor structure according to this invention.

The difference between the well shielding layer 20a depicted in FIG. 6 and the well shielding layer 20 depicted in FIG. 5 is that the well shielding layer 20a depicted in FIG. 6 omits the N type deep ion well 28. The rest parts of the well shielding layer 20a are the same as that of the well shielding layer 20 depicted in FIG. 5. It is noteworthy that the well shielding layer 20a likewise includes a plurality of N type diffusion regions 22a, 22b and a plurality of P– diffusion regions 24 arranged in a chessboard-like manner.

Figure 7:
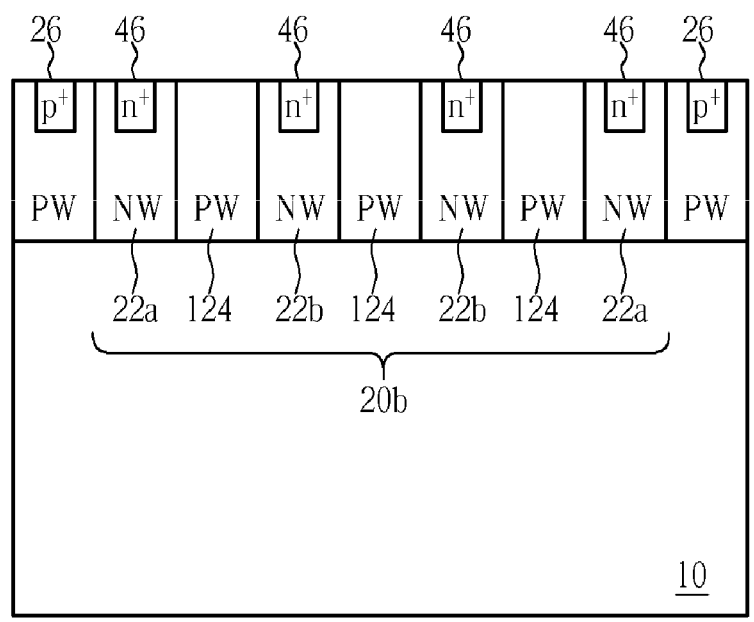

The difference between the well shielding layer 20b depicted in FIG. 7 and the well shielding layer 20a depicted in FIG. 6 is that the plurality of P– diffusion regions 24 of the well shielding layer 20a in FIG. 6 are replaced with a plurality of P type ion wells 124. The doping concentration of the P type ion wells 124 is higher than that of the P– diffusion regions 24. In addition, the P+ pick-up ring 26 is formed in the P type ion well 124. In FIG. 7, the plurality of N type diffusion regions 22a, 22b and the plurality of P type ion wells 124 of the well shielding layer 20b are arranged in a chessboard-like manner.

Figure 8:
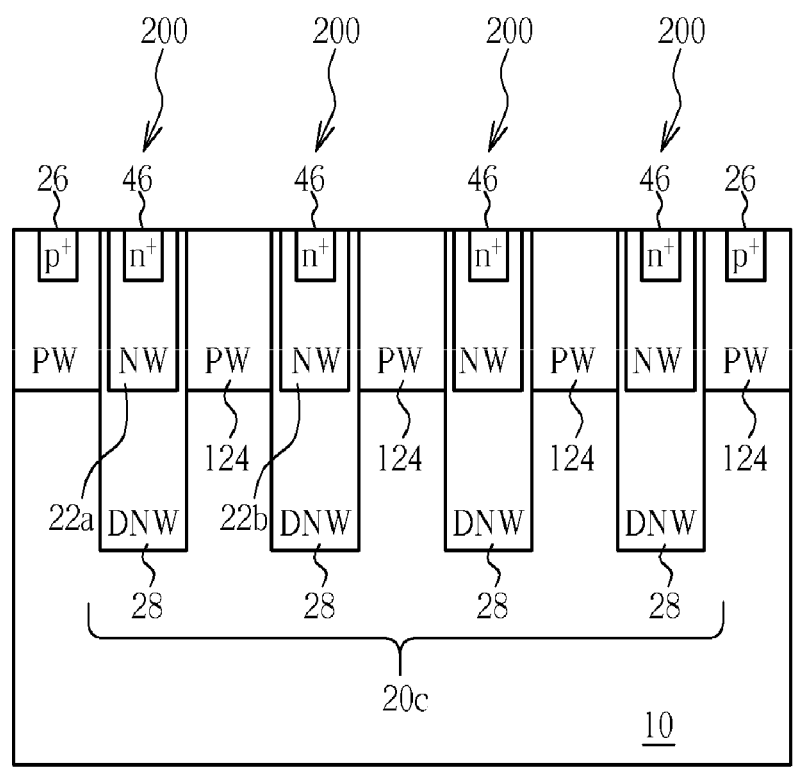

The difference between the well shielding layer 20c depicted in FIG. 8 and the well shielding layer 20b depicted in FIG. 7 is that N type deep ion wells 28 are added into the well shielding layer 20c such that triple well structure 200 is constructed. The triple well structure 200 includes a triple well consisting of N+ diffusion regions 46-N type diffusion regions 22a-N type deep ion well 28 and a triple well consisting of N+ diffusion regions 46-N type diffusion regions 22b-N type deep ion well 28. The triple well structure 200 and the plurality of P type ion wells 124 of the well shielding layer 20c are arranged in a chessboard-like manner.

Figure 9:
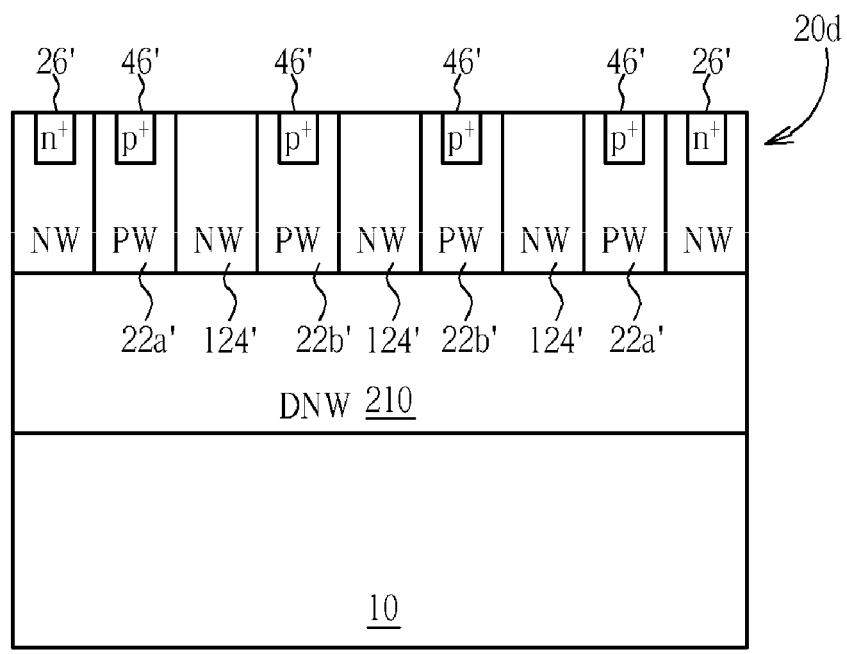

The differences between the well shielding layer 20d depicted in FIG. 9 and the well shielding layer 20b depicted in FIG. 7 include the polarity of the diffusion regions and an additional N type deep ion well 210. In FIG. 9, the well shielding layer 20d is composed of a plurality of P type diffusion regions 22a', 22b' and a plurality of N type ion wells 124', which are arranged in a chessboard-like manner. A P+ diffusion region 46' is formed in each of the plurality of P type diffusion regions 22a', 22b'. An N+ pick-up ring 26' that encircles the well shielding layer 20d is disposed in the semiconductor substrate 10. The N+ pick-up ring 26' is formed in an N type ion well. The well shielding layer 20d is fabricated in the N type deep ion well 210.

Figure 10:
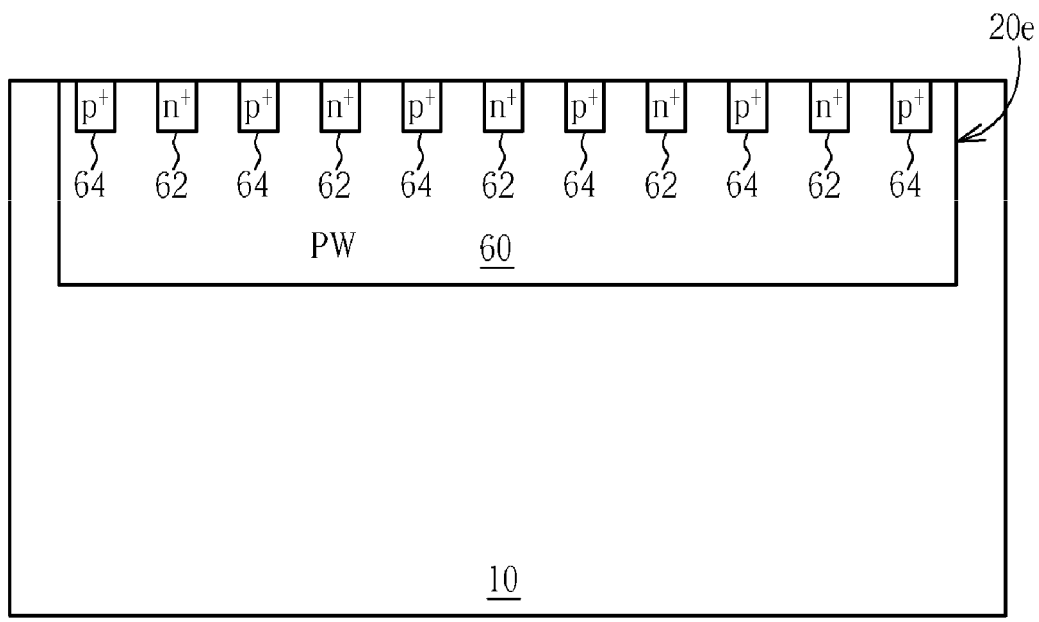

As shown in FIG. 10, the well shielding layer 20e comprises a plurality of N+ regions 62 and a plurality of P+ regions 64 which are arranged in an alternate, chessboard-like manner. The plurality of N+ regions 62 and the plurality of P+ regions 64 are formed in a P type ion well 60 of the semiconductor substrate 10 such as a P type silicon substrate. The N+ region 62 and the P+ region 64 are not mutually connected such that the PN junction under reverse biasing conditions can produce larger depletion capacitance. Taking the structure depicted in FIG. 10 as an example, the aforesaid PN junction is N+/P well junction. The P+ regions 64 can function as a pick-up region for picking up the P well voltage.

Figure 11:
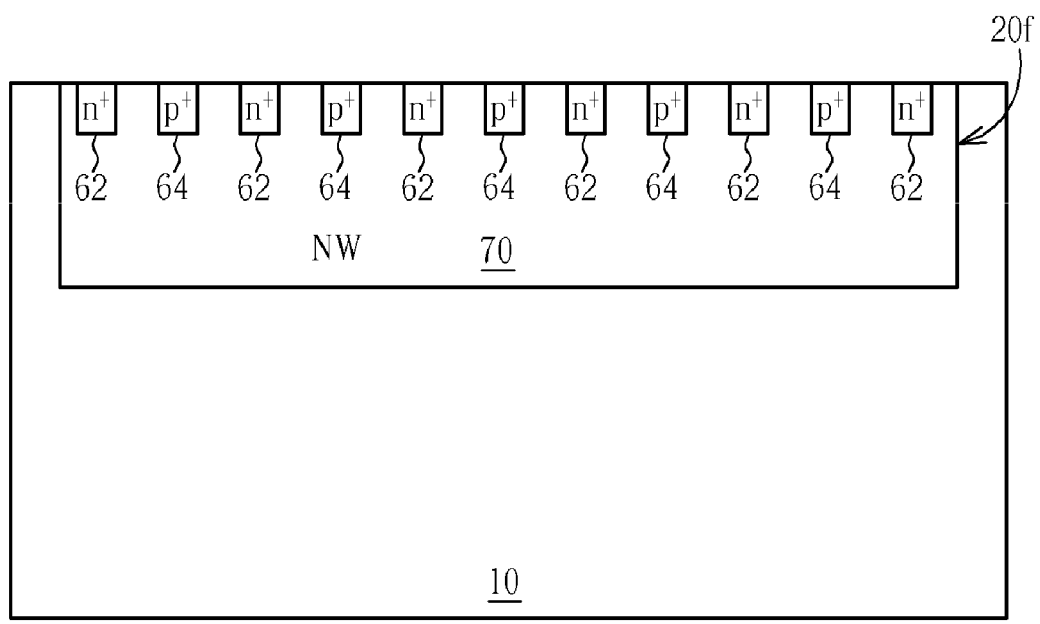

As shown in FIG. 11, the well shielding layer 20f comprises a plurality of N+ regions 62 and a plurality of P+ regions 64 which are arranged in an alternate, chessboard-like manner. The plurality of N+ regions 62 and the plurality of P+ regions 64 are formed in an N type ion well 70 of the semiconductor substrate 10 such as a P type silicon substrate. Likewise, the N+ region 62 and the P+ region 64 are not mutually connected such that the PN junction under reverse biasing conditions can produce larger depletion capacitance.

Figure 12:
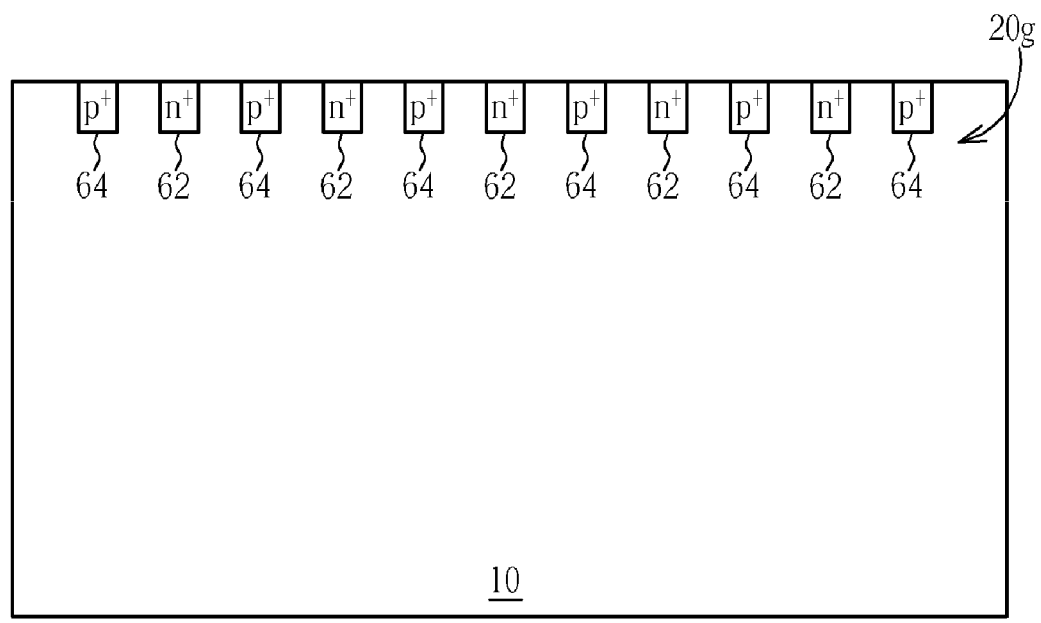

As shown in FIG. 12, the well shielding layer 20g comprises a plurality of N+ regions 62 and a plurality of P+ regions 64 which are arranged in an alternate, chessboard-like manner. The plurality of N+ regions 62 and the plurality of P+ regions 64 are directly formed in the semiconductor substrate 10 instead of in an ion well.

To sum up, the chessboard-like layout of the well shielding layer 20, 20a~20g is capable of effectively reducing the substrate loss of the integrated inductor structure itself, including displacement current and eddy current. Compared to the prior art, the present invention integrated inductor structure has higher quality factor and self-resonance frequency.

Further, the present invention provides a novel chessboard-like or mesh-like layout of the well shielding layer plus N type deep ion well 28 to interrupt deeper eddy current. The plurality of N type diffusion regions and the plurality of P− diffusion regions arranged in a chessboard-like manner are capable of effectively interrupting the possible path of the eddy current.

Those skilled in the art will readily observe that numerous modifications and alterations of the device and method may be made while retaining the teachings of the invention.

What is claimed is:

1. An integrated inductor structure, comprising:
a semiconductor substrate;
a metal coil layer on the semiconductor substrate;
at least one dielectric layer between the semiconductor substrate and the metal coil layer;
a well shielding layer disposed in the semiconductor substrate directly under the metal coil layer, wherein the well shielding layer has an outer area comprising a plurality of peripheral N type diffusion regions surrounding an inner area chequered with a plurality of N type diffusion regions and a plurality of P type diffusion regions, and wherein the plurality of peripheral N type diffusion regions do not overlap with the metal coil layer;
a P type pick-up ring disposed in the semiconductor substrate, wherein the P type pick-up ring surrounds the well shielding layer; and
a guard ring disposed directly over the P type pick-up ring, the guard ring comprising a plurality of metal layers and a plurality of via plugs, wherein the guard ring includes an opening for allowing connection of the metal coil layer to an external circuit.

2. The integrated inductor structure according to claim 1 wherein the plurality of N type diffusion regions and the plurality of peripheral N type diffusion regions are electrically connected to one another.

3. The integrated inductor structure according to claim 1 wherein the plurality of N type diffusion regions and the plurality of peripheral N type diffusion regions are coupled to a positive bias voltage with respect to the semiconductor substrate.

4. The integrated inductor structure according to claim 1 wherein the P type pick-up ring is grounded.

5. The integrated inductor structure according to claim 1 wherein the plurality of N type diffusion regions and the plurality of peripheral N type diffusion regions are electrically connected to one another by means of diffusion.

6. The integrated inductor structure according to claim 1 wherein the semiconductor substrate is a P type silicon substrate.

7. The integrated inductor structure according to claim 1, wherein each of the metal layers and via plugs are disposed in an alternating fashion with respect to each other.

8. An integrated inductor structure, comprising:
a semiconductor substrate;
a metal coil layer on the semiconductor substrate;
at least one dielectric layer between the semiconductor substrate and the metal coil layer;
a well shielding layer disposed in the semiconductor substrate directly under the metal coil layer, wherein the well shielding layer has an outer area comprising a plurality of peripheral N type diffusion regions surrounding an inner area chequered with a plurality of N type diffusion regions and a plurality of P type diffusion regions, and wherein the plurality of peripheral N type diffusion regions do not overlap with the metal coil layer;
a P type pick-up ring disposed in the semiconductor substrate, wherein the P type pick-up ring surrounds the well shielding layer; and
a guard ring disposed directly over the P type pick-up ring, the guard ring comprising a plurality of metal layers and a plurality of via plugs,
wherein the plurality of peripheral N type diffusion regions is electrically connected to an overlying metal pick-up ring.

9. The integrated inductor structure according to claim 8 wherein the metal pick-up ring is coupled to a $V_{DD}$ voltage.

10. An integrated inductor structure, comprising:
a semiconductor substrate;
a metal coil layer on the semiconductor substrate;
at least one dielectric layer between the semiconductor substrate and the metal coil layer;
a well shielding layer disposed in the semiconductor substrate directly under the metal coil layer, wherein the well shielding layer has an outer area comprising a plurality of peripheral N well regions surrounding an inner area comprising a plurality of N well regions and a plurality of P well regions, and wherein each of the N well regions is composed of a corresponding N type deep ion well and an N− well inside each of the corresponding N type deep ion wells;
a P type pick-up ring disposed in the semiconductor substrate, wherein the P type pick-up ring surrounds the well shielding layer; and a guard ring coupled to the P type pick-up ring, the guard ring comprising a plurality of metal layers and a plurality of via plugs, wherein the plurality of peripheral N well regions do not overlap with the metal coil layer, and wherein the plurality of peripheral N well regions are electrically connected to an overlying metal pick-up ring.

11. The integrated inductor structure according to claim 10 wherein the plurality of N well regions, the plurality of peripheral N well regions, and the plurality of P well regions are arranged in a chessboard-like manner.

12. The integrated inductor structure according to claim 10 wherein the plurality of N well regions and the plurality of peripheral N well regions are electrically connected to one another.

13. The integrated inductor structure according to claim 10 wherein the plurality of N well regions and the plurality of peripheral N well regions are coupled to a positive bias voltage with respect to the semiconductor substrate.

14. The integrated inductor structure according to claim 10 wherein the P type pick-up ring is grounded.

15. The integrated inductor structure according to claim 10 wherein the metal pick-up ring is coupled to a $V_{DD}$ voltage.

16. The integrated inductor structure according to claim 10 wherein the plurality of N well regions and the plurality of peripheral N well regions are electrically connected to one another by means of diffusion.

17. The integrated inductor structure according to claim 10 wherein the semiconductor substrate is a P type silicon substrate.

18. The integrated inductor structure according to claim 10 wherein each of the N well regions and the peripheral N well regions further comprises an N+ diffusion region inside the N− well region.

* * * * *